United States Patent
Jeon (10) Patent No.: US 9,177,906 B1
(45) Date of Patent: Nov. 3, 2015

(54) SEMICONDUCTOR PACKAGE INCLUDING AN EXTENDED BANDWIDTH

(71) Applicant: SK hynix Inc., Icheon-si Gyeonggi-do (KR)

(72) Inventor: Seon Kwang Jeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/635,640

(22) Filed: Mar. 2, 2015

(30) Foreign Application Priority Data

Nov. 13, 2014 (KR) .......................... 10-2014-0157710

(51) Int. Cl.
| | |
|---|---|
| H01L 23/00 | (2006.01) |
| H01L 23/498 | (2006.01) |
| H01L 25/07 | (2006.01) |
| H01L 23/48 | (2006.01) |
| H01L 23/522 | (2006.01) |
| H01L 23/538 | (2006.01) |
| H01L 23/52 | (2006.01) |

(52) U.S. Cl.
CPC ........ *H01L 23/49838* (2013.01); *H01L 23/481* (2013.01); *H01L 23/49811* (2013.01); *H01L 23/49827* (2013.01); *H01L 23/52* (2013.01); *H01L 23/522* (2013.01); *H01L 23/5226* (2013.01); *H01L 23/538* (2013.01); *H01L 23/5383* (2013.01); *H01L 23/5384* (2013.01); *H01L 25/074* (2013.01)

(58) Field of Classification Search
CPC ... H01L 23/52; H01L 23/522; H01L 23/5226; H01L 23/538; H01L 23/5283; H01L 23/5384
See application file for complete search history.

(56) References Cited

U.S. PATENT DOCUMENTS

| | | | | |
|---|---|---|---|---|
| 2007/0108574 | A1* | 5/2007 | Kang et al. | 257/678 |
| 2009/0108425 | A1* | 4/2009 | Lee et al. | 257/679 |
| 2010/0301466 | A1* | 12/2010 | Taoka et al. | 257/686 |
| 2012/0248621 | A1* | 10/2012 | Sadaka | 257/774 |
| 2013/0069229 | A1* | 3/2013 | Kang et al. | 257/737 |
| 2014/0063723 | A1* | 3/2014 | Ro et al. | 361/679.32 |
| 2015/0113195 | A1* | 4/2015 | Kim | 710/308 |

FOREIGN PATENT DOCUMENTS

KR 1020110137565 A 12/2011

* cited by examiner

*Primary Examiner* — Ngan Ngo
(74) *Attorney, Agent, or Firm* — William Park & Associates Ltd.

(57) ABSTRACT

A semiconductor package may include first and second semiconductor chips stacked one upon the other, and each including, over a bottom surface thereof, first normal pads electrically coupled with first input/output circuits and first dummy pads located over the bottom surface of the first semiconductor chip. The semiconductor package may include first through electrodes passed through the first semiconductor chip, and electrically coupled to the first dummy pads of the first semiconductor chip and the first normal pads of the second semiconductor chip. The semiconductor package may include a substrate configured to support the bottom surface of the first semiconductor chip, and including first coupling pads electrically coupled with the first normal pads and the first dummy pads of the first semiconductor chip, respectively.

20 Claims, 7 Drawing Sheets

SEMICONDUCTOR PACKAGE INCLUDING AN EXTENDED BANDWIDTH

CROSS-REFERENCES TO RELATED APPLICATION

The present application claims priority under 35 U.S.C. §119(a) to Korean Patent Application No. 10-2014-157710, filed on Nov. 13, 2014, in the Korean Intellectual Property Office, which is incorporated herein by reference in its entirety.

BACKGROUND

1. Technical Field

Various embodiments generally relate to a semiconductor technology, and more particularly, to a semiconductor package including an extended bandwidth.

2. Related Art

Packaging technologies for a semiconductor device are continuously being developed. Developments have been made toward miniaturization and high capacities. Recently, various technologies for a stacked semiconductor package, capable of satisfying miniaturization, high capacity and mounting efficiency, are being developed.

The term "stack" with regards to the semiconductor industry may refer to a technology of vertically piling at least two semiconductor chips or packages. In the case of a memory device, by using a stacking technology, it may be possible to realize a product having a memory capacity larger than that obtainable through a semiconductor integration process. Thus, improving mounting area utilization efficiency.

Among stacked semiconductor packages, a stacked semiconductor package using through electrodes has a structure whereby through electrodes are formed in semiconductor chips. The semiconductor chips may be physically connected and electrically coupled in a vertical direction by means of the through electrodes.

In the stacked semiconductor package using through electrodes, since the through electrodes, vertically passing through the semiconductor chips, provide common electrical coupling nodes, signals may be simultaneously inputted to the semiconductor chips. However, the signals may not be simultaneously outputted from the semiconductor chips. Therefore, even though the number of stacked semiconductor chips has increased, the bandwidths used for the stacked semiconductor chips remains fixed.

SUMMARY

In an embodiment, a semiconductor package may include first and second semiconductor chips stacked one upon the other, and each including, over a bottom surface thereof, first normal pads electrically coupled with first input/output circuits and first dummy pads located over the bottom surface of the first semiconductor chip. The semiconductor package may include first through electrodes passed through the first semiconductor chip, and electrically coupled to the first dummy pads of the first semiconductor chip and the first normal pads of the second semiconductor chip. The semiconductor package may include a substrate configured to support the bottom surface of the first semiconductor chip, and including first coupling pads electrically coupled with the first normal pads and the first dummy pads of the first semiconductor chip, respectively.

A semiconductor package may include a first semiconductor chip including a bottom surface, normal pads electrically coupled to input/output circuits over the bottom surface of the first semiconductor chip, and dummy pads located over the bottom surface of the first semiconductor chip. The semiconductor package may include a second semiconductor chip stacked over the first semiconductor chip, the second semiconductor chip including a bottom surface, and normal pads electrically coupled to input/output circuits over the bottom surface of the second semiconductor chip. The semiconductor package may include through electrodes passed through the first semiconductor chip, and electrically coupled to the dummy pads of the first semiconductor chip and the normal pads of the second semiconductor chip. The semiconductor package may include a substrate located below the bottom surface of the first semiconductor chip, and including coupling pads electrically coupled with the normal pads of the first semiconductor chip and the second semiconductor chip, respectively.

DETAILED DESCRIPTION

Hereinafter, a semiconductor package including an extended bandwidth will be described below with reference to the accompanying drawings through various examples of embodiments.

Figure 1:
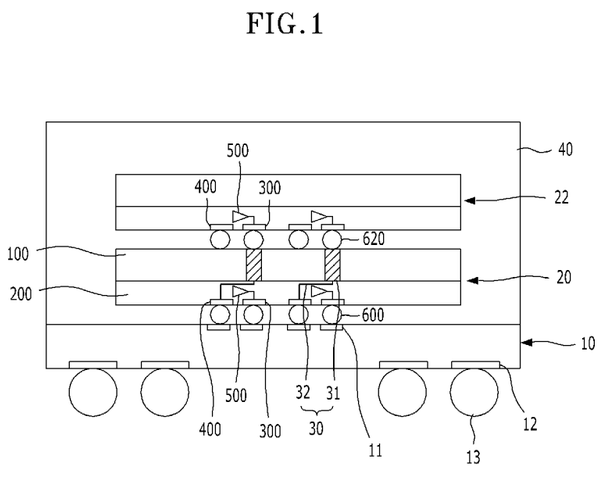
FIG. 1 is a cross-sectional view illustrating a representation of an example of a semiconductor package in accordance with an embodiment.

Referring to FIG. 1, a semiconductor package in accordance with an embodiment may include a substrate 10, first and second semiconductor chips 20 and 22, and through electrodes 30 (i.e., first through electrodes 30).

The substrate 10 may be a printed circuit board (PCB). A plurality of coupling pads 11 (i.e., first coupling pads 11) may be formed on the top surface of the substrate 10. A plurality of electrode pads 12 may be formed on the bottom surface of the substrate 10. External coupling electrodes 13 such as, for example but not limited to, solder balls may be formed on the electrode pads 12. While not illustrated, the substrate 10 may include circuit wiring (not illustrated) electrically coupling the coupling pads 11 formed on the top surface and the electrode pads 12 formed on the bottom surface. While it is illustrated that the substrate 10 is a printed circuit board, the embodiments are not limited to such. For example, the substrate 10 may be configured by any one of a lead frame, a flexible substrate and an interposer.

The first semiconductor chip 20 and the second semiconductor chip 22 may be sequentially stacked on the substrate 10.

The first and second semiconductor chips 20 and 22 may be semiconductor chips manufactured on a single wafer and may then be individualized. The individual semiconductor chips may have substantially the same structure.

Each of the first and second semiconductor chips 20 and 22 may include an active layer 200 and a wafer substrate 100. The wafer substrate 100 may be formed on the active layer 200. The wafer substrate 100 may be a silicon wafer, and an integrated circuit (not illustrated) may be formed in the active layer 200. The integrated circuit may include semiconductor memory elements or/and semiconductor logic elements. The integrated circuit may include a structure whereby individual elements such as transistors, resistors, capacitors and fuses necessary for operations of a chip are electrically coupled with one another.

The first and second semiconductor chips 20 and 22 may be stacked in such a manner whereby the active layer 200 faces the substrate 10 and the wafer substrate 100 faces away from the substrate 10.

Each of the first and second semiconductor chips 20 and 22 may have a bottom surface provided by the active layer 200. The Normal pads 300 and the dummy pads 400 may be formed on the bottom surface of each of the first and second semiconductor chips 20 and 22. Normal pads 300 (i.e., first normal pads 300) are electrically coupled to input/output circuits 500 (i.e., first input/output circuits 500). The normal pads 300, as the external terminals of the integrated circuit for electrical coupling with an external device, may be electrically coupled to the integrated circuit through the input/output circuits 500. Dummy pads 400 (i.e., first dummy pads 400) are provided but are not electrically coupled to the input/output circuits 500. The normal pads 300 may include a pad layout structure according to the existing chip design standard. The dummy pads 400 may be disposed in extra spaces left after the normal pads 300 are disposed. In an embodiment, the dummy pads 400 may correspond one-to-one to the normal pads 300. And, the respective dummy pads 400 may be disposed around the normal pads 300 corresponding to it.

The input/output circuits 500 may be formed in the active layer 200, and may include input buffers, output drivers, and so forth. The input/output circuits 500 may transfer the signals inputted from an exterior through the normal pads 300, to the integrated circuit, or may transfer the signals outputted from the integrated circuit, to the exterior through the normal pads 300.

The through electrodes 30 may electrically couple the dummy pads 400 of the first semiconductor chip 20 and the normal pads 300 of the second semiconductor chip 22, through the first semiconductor chip 20. In an embodiment, each of the through electrodes 30 may include a conductive pillar 31 passing through the wafer substrate 100 of the first semiconductor chip 20. In an embodiment, each of the through electrodes 30 may include a circuit pattern 32 formed in the active layer 200 of the first semiconductor chip 20 and electrically coupling the conductive pillar 31 and the dummy pad 400 of the first semiconductor chip 20.

Conductive pillars 31 may be formed by defining via holes in the wafer substrate 100 of the first semiconductor chip 20 and filling a conductive material, such as, for example, copper, aluminum, an aluminum alloy, SnAg and Au, into the via holes. Before filling the conductive material in the via holes, in order to insulate the conductive pillars 31 and the wafer substrate 100 from each other, dielectric spacers may be formed on the surfaces of the via holes by using, for example, an oxide layer, a nitride layer or an organic layer.

In an embodiment, the conductive pillars 31 may pass through the wafer substrate 100 of the first semiconductor chip 20 on the same lines with the normal pads 300. In an embodiment, the conductive pillars 31 may pass through the wafer substrate 100 of the first semiconductor chip 20 in vertical alignment with the normal pads 300. The second semiconductor chip 22 may be stacked vertically on the first semiconductor chip 20 such that the normal pads 300 of the second semiconductor chip 22 are aligned on the same lines with the normal pads 300 of the first semiconductor chip 20. The second semiconductor chip 22 may be stacked vertically on the first semiconductor chip 20 such that the normal pads 300 of the second semiconductor chip 22 are aligned vertically with the normal pads 300 of the first semiconductor chip 20.

Conductive coupling members 600 and 620 such as, for example but not limited to, bumps may be formed on the normal pads 300 and the dummy pads 400 of the first and second semiconductor chips 20 and 22.

The normal pads 300 and the dummy pads 400 of the first semiconductor chip 20 may be electrically coupled with the coupling pads 11 of the substrate 10 by the medium of the conductive coupling members 600, and the normal pads 300 of the second semiconductor chip 22 may be electrically coupled to the through electrodes 30 by the medium of the conductive coupling members 620.

In an embodiment, data buses may be formed through the through electrodes 30, and the integrated circuit formed in the second semiconductor chip 22 may be inputted with or output data through the through electrodes 30, separately from the first semiconductor chip 20.

A molding part 40 may be formed on the top surface of the substrate 10 to substantially cover or cover the first and second semiconductor chips 20 and 22. The molding part may be used to protect the first and second semiconductor chips 20 and 22 from external circumstances.

While it is illustrated as an example in the embodiments described above with reference to FIG. 1 that the conductive pillars 31 of the through electrodes 30 pass through the wafer substrate 100 of the first semiconductor chip 20 on the same lines with (or vertically aligned with) the normal pads 300 of the first semiconductor chip 20 and the second semiconductor chip 22 is vertically stacked on the first semiconductor chip 20, it is to be noted that the technical spirit of the embodiments are not limited to such an example.

Figure 2:
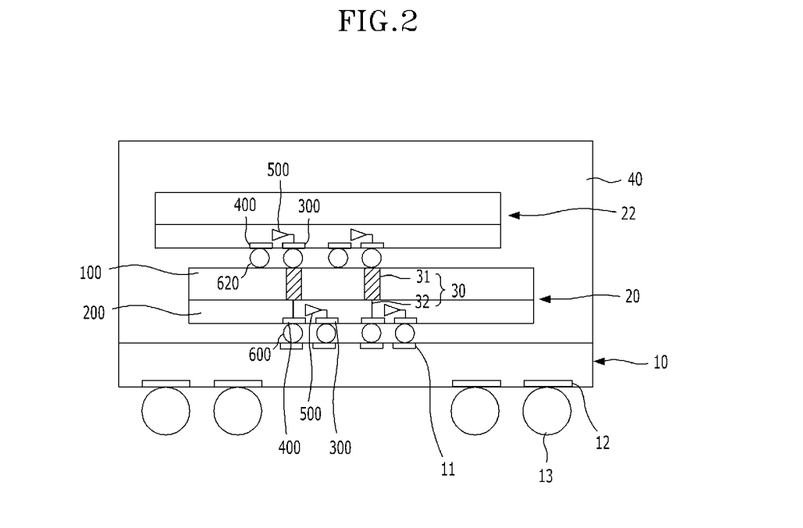
FIG. 2 is a cross-sectional view illustrating a representation of an example of a semiconductor package in accordance with an embodiment.

For example, referring to FIG. 2, the conductive pillars 31 of the through electrodes 30 may pass through the wafer substrate 100 of the first semiconductor chip 20 on the same lines with the dummy pads 400 of the first semiconductor chip 20. For example, referring to FIG. 2, the conductive pillars 31 of the through electrodes 30 may pass through the wafer substrate 100 of the first semiconductor chip 20 and be vertically aligned with the dummy pads 400 of the first semiconductor chip 20. The second semiconductor chip 22 may be stacked to deviate with respect to the first semiconductor chip 20 in a such manner that the normal pads 300 of the second semiconductor chip 22 are positioned on the same lines with the dummy pads 400 of the first semiconductor chip 20. The second semiconductor chip 22 may be stacked to deviate with respect to the first semiconductor chip 20 in a such manner that the normal pads 300 of the second semiconductor chip 22 are positioned to vertically align with the dummy pads 400 of the first semiconductor chip 20.

Figure 3:
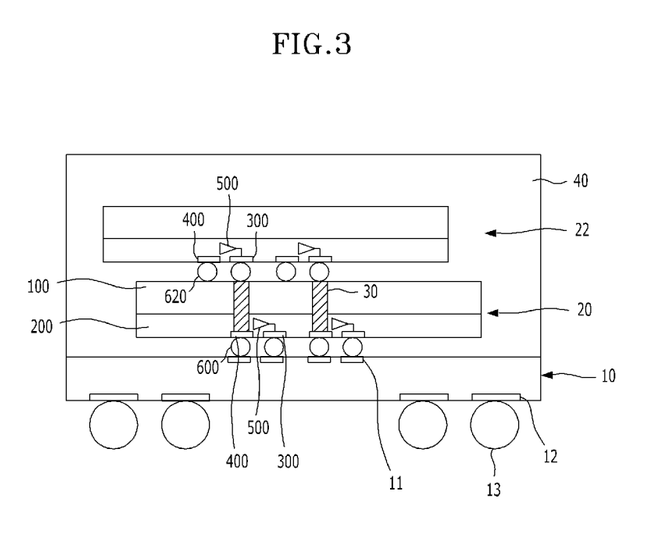
FIG. 3 is a cross-sectional view illustrating a representation of an example of a semiconductor package in accordance with an embodiment.

While it is illustrated as examples in the embodiments described above with reference to FIGS. 1 and 2 that each of the through electrodes 30 are configured by the conductive pillar 31 and the circuit pattern 32, it is to be noted that the embodiments are not limited to such examples. For example, referring to FIG. 3, each of the through electrodes 30 may be configured by a conductive pillar electrically coupled to the dummy pad 400 by passing through the wafer substrate 100 and the active layer 200 of the first semiconductor chip 20.

Although it is illustrated as examples in the embodiments described above with reference to FIGS. 1 to 3 that 2 semiconductor chips are stacked on a substrate, it is to be noted that the technical spirits of the embodiments are not limited to such examples and the number of semiconductor chips to be stacked may be larger than 2. Embodiments including the number of semiconductor chips to be stacked being larger than 2 will be described below with reference to FIGS. 4 to 6.

Figure 4:
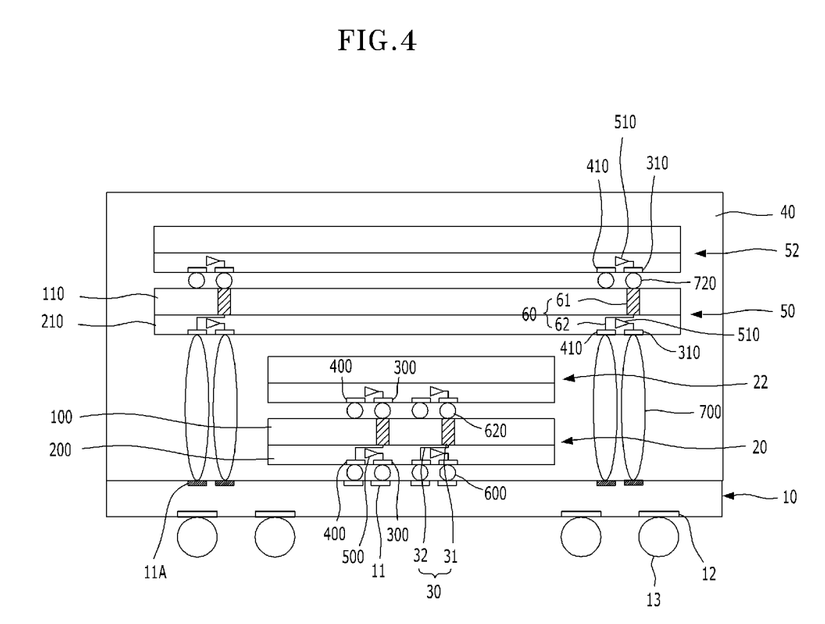
FIG. 4 is a cross-sectional view illustrating a representation of an example of a semiconductor package in accordance with an embodiment.

Referring to FIG. 4, a semiconductor package in accordance with an embodiment may include a substrate 10, first and second semiconductor chips 20 and 22, and first through electrodes 30. The semiconductor package may include third and fourth semiconductor chips 50 and 52, and second through electrodes 60.

The substrate 10 may be a printed circuit board (PCB). A plurality of first coupling pads 11 may be formed on the center portion of the top surface of the substrate 10. A plurality of second coupling pads 11A may be formed on the peripheral portion of the top surface of the substrate 10. A plurality of electrode pads 12 may be formed on the bottom surface of the substrate 10, and external coupling electrodes 13 such as, for example but not limited to, solder balls may be formed on the electrode pads 12. While not illustrated, the substrate 10 may include circuit wirings (not illustrated) which electrically couple the first and second coupling pads 11 and 11A formed on the top surface and the electrode pads 12 formed on the bottom surface. While it is illustrated that the substrate 10 is a printed circuit board, the embodiments are not limited to such. For example, the substrate 10 may be configured by any one of a lead frame, a flexible substrate and an interposer.

The first semiconductor chip 20 and the second semiconductor chip 22 may be sequentially stacked on the substrate 10.

The first and second semiconductor chips 20 and 22 may be semiconductor chips manufactured on a single wafer and are then individualized, and may have substantially the same structure.

Each of the first and second semiconductor chips 20 and 22 may include an active layer 200 and a wafer substrate 100 formed on the active layer 200. The wafer substrate 100 may be a silicon wafer. An integrated circuit (not illustrated) may be formed in the active layer 200. The integrated circuit may include semiconductor memory elements or/and semiconductor logic elements, and may include a structure whereby individual elements such as transistors, resistors, capacitors and fuses necessary for operations of a chip are electrically coupled with one another.

The first and second semiconductor chips 20 and 22 may be stacked such that the active layer 200 faces the substrate 10 and the wafer substrate 100 faces away from the substrate 10.

Each of the first and second semiconductor chips 20 and 22 may include a bottom surface provided by the active layer 200. The first normal pads 300 and the first dummy pads 400 may be formed on the bottom surface of each of the first and second semiconductor chips 20 and 22. First normal pads 300 are electrically coupled to first input/output circuits 500. The first normal pads 300, as the external terminals of the integrated circuit for electrical coupling with an external device, may be electrically coupled to the integrated circuit through the first input/output circuits 500. First dummy pads 400 are provided but are not electrically coupled to the first input/output circuits 500. The first normal pads 300 may include a pad layout structure according to the existing chip design standard. The first dummy pads 400 may be disposed in extra spaces left after the first normal pads 300 are disposed. In an embodiment, the first dummy pads 400 may correspond one-to-one to the first normal pads 300. The respective first dummy pads 400 may be disposed around the first normal pad 300 corresponding to it.

The first input/output circuits 500 may be formed in the active layer 200, and may include input buffers, output drivers, and so forth. The first input/output circuits 500 may transfer the signals inputted from an exterior through the first normal pads 300, to the integrated circuit, or may transfer the signals outputted from the integrated circuit, to the exterior through the first normal pads 300.

The first through electrodes 30 may electrically couple the first dummy pads 400 of the first semiconductor chip 20 and the first normal pads 300 of the second semiconductor chip 22, through the first semiconductor chip 20. Data buses may be formed through the first through electrodes 30, and the integrated circuit formed in the second semiconductor chip 22 may be inputted with or output data through the first through electrodes 30, separately from the first semiconductor chip 20.

In an embodiment, each of the first through electrodes 30 may include a conductive pillar 31 passing through the wafer substrate 100 of the first semiconductor chip 20. In an embodiment, each of the first through electrodes 30 may include a circuit pattern 32 formed in the active layer 200 of the first semiconductor chip 20 and electrically coupling the conductive pillar 31 and the first dummy pad 400 of the first semiconductor chip 20.

While it is illustrated as an example in an embodiment that each of the first through electrodes 30 is configured by the conductive pillar 31 and the circuit pattern 32, it is to be noted that the technical spirit of the embodiments are not limited to such an example. As described above with reference to FIG. 3, each of the first through electrodes 30 may be configured by only a conductive pillar electrically coupled to the first dummy pad 400 by passing through the wafer substrate 100 and the active layer 200 of the first semiconductor chip 20.

Referring again to FIG. 4, conductive pillars 31 may be formed by defining via holes in the wafer substrate 100 of the first semiconductor chip 20 and filling a conductive material, such as, for example, copper, aluminum, an aluminum alloy, SnAg and Au, into the via holes. Before filling the conductive material in the via holes, in order to insulate the conductive pillars 31 and the wafer substrate 100 from each other, dielectric spacers may be formed on the surfaces of the via holes by using, for example, an oxide layer, a nitride layer or an organic layer.

In an embodiment, the conductive pillars 31 may pass through the wafer substrate 100 of the first semiconductor chip 20 on the same lines with the first normal pads 300. In an embodiment, the conductive pillars 31 may pass through the wafer substrate 100 of the first semiconductor chip 20 in vertical alignment with the first normal pads 300. The second semiconductor chip 22 may be stacked vertically on the first semiconductor chip 20 such that the first normal pads 300 of the second semiconductor chip 22 are aligned on the same lines with the first normal pads 300 of the first semiconductor chip 20. The second semiconductor chip 22 may be stacked vertically on the first semiconductor chip 20 such that the first normal pads 300 of the second semiconductor chip 22 are aligned vertically with the first normal pads 300 of the first semiconductor chip 20.

While it is illustrated as an example in an embodiment that the conductive pillars 31 of the first through electrodes 30 pass through the wafer substrate 100 of the first semiconductor chip 20 on the same lines with (or vertically aligned with) the first normal pads 300 of the first semiconductor chip 20 and the second semiconductor chip 22 is vertically stacked on the first semiconductor chip 20, it is to be noted that the technical spirit of the embodiment is not limited to such an example. For example, as described above with reference to FIG. 2, the conductive pillars 31 of the first through electrodes 30 may pass through the wafer substrate 100 of the first semiconductor chip 20 on the same lines with (or vertically aligned with) the first dummy pads 400 of the first semiconductor chip 20, and the second semiconductor chip 22 may be stacked to deviate with respect to the first semiconductor chip 20 in a such manner that the first normal pads 300 of the second semiconductor chip 22 are positioned (vertically aligned with or) on the same lines with the first dummy pads 400 of the first semiconductor chip 20.

Referring again to FIG. 4, Conductive coupling members 600 and 620 such as, for example but not limited to, bumps may be formed on the first normal pads 300 and the first dummy pads 400 of the first and second semiconductor chips 20 and 22. The first normal pads 300 and the first dummy pads 400 of the first semiconductor chip 20 may be electrically coupled to the first coupling pads 11 of the substrate 10 by the medium of the conductive coupling members 600. The first normal pads 300 of the second semiconductor chip 22 may be electrically coupled to the first through electrodes 30 by the medium of the conductive coupling members 620.

The respective third and fourth semiconductor chips 50 and 52 may include an area larger than the respective first and second semiconductor chips 20 and 22, and may be stacked over the substrate 10 with the first and second semiconductor chips 20 and 22 interposed therebetween.

The third and fourth semiconductor chips 50 and 52 may be semiconductor chips manufactured on a single wafer and then individualized, and may include substantially the same structure.

Each of the third and fourth semiconductor chips 50 and 52 may include an active layer 210 and a wafer substrate 110 formed on the active layer 210. The wafer substrate 110 may be a silicon wafer. An integrated circuit (not illustrated) may be formed in the active layer 210. The integrated circuit may include semiconductor memory elements or/and semiconductor logic elements, and may include a structure of individual elements such as transistors, resistors, capacitors and fuses necessary for operations of a chip are electrically coupled with one another.

The third and fourth semiconductor chips 50 and 52 may be stacked such that the active layer 210 faces the substrate 10 and the wafer substrate 110 faces away from the substrate 10.

Each of the third and forth semiconductor chips 50 and 52 may include a bottom surface provided by the active layer 210. Second normal pads 310 and second dummy pads 410 may be formed on the bottom surface of each of the third and fourth semiconductor chips 50 and 52. Second normal pads 310 may be electrically coupled with second input/output circuits 510. The second normal pads 310, as the external terminals of the integrated circuit for electrical coupling with an external device, may be electrically coupled to the integrated circuit through the second input/output circuits 510. Second dummy pads 410 are not electrically coupled with second input/output circuits 510. The second normal pads 310 may include a pad layout structure according to the existing chip design standard, and the second dummy pads 410 may be disposed in extra spaces left after the second normal pads 310 are disposed. In an embodiment, the second dummy pads 410 may correspond one-to-one to the second normal pads 310. And, the respective second dummy pads 410 may be disposed around the second normal pads 310 corresponding to it.

The second input/output circuits 510 may be formed in the active layer 210, and may include, for example, input buffers, output drivers, and so forth. The second input/output circuits 510 may transfer the signals inputted from an exterior through the second normal pads 310, to the integrated circuit, or may transfer the signals outputted from the integrated circuit, to the exterior through the second normal pads 310.

The second through electrodes 60 may electrically couple the second dummy pads 410 of the third semiconductor chip 50 and the second normal pads 310 of the fourth semiconductor chip 52, through the third semiconductor chip 50. In an embodiment, each of the second through electrodes 60 may include a conductive pillar 61 passing through the wafer substrate 110 of the third semiconductor chip 50, and a circuit pattern 62 formed in the active layer 210 of the third semiconductor chip 50 and electrically coupling the conductive pillar 61 and the second dummy pad 410 of the third semiconductor chip 50.

Conductive pillars 61 may be formed by defining via holes in the wafer substrate 110 of the third semiconductor chip 50 and filling a conductive material, such as, for example, copper, aluminum, an aluminum alloy, SnAg and Au, into the via holes. Before filling the conductive material in the via holes, in order to insulate and isolate the conductive pillars 61 and the wafer substrate 110 from each other, dielectric spacers may be formed on the surfaces of the via holes by using, for example, an oxide layer, a nitride layer or an organic layer.

In an embodiment, the conductive pillars 61 may pass through the wafer substrate 110 of the third semiconductor chip 50 on the same lines with (or in vertical alignment with) the second normal pads 310. The fourth semiconductor chip 52 may be stacked vertically on the third semiconductor chip 50 such that the second normal pads 310 of the fourth semiconductor chip 52 are aligned on the same lines with (or are vertically aligned with) the second normal pads 310 of the third semiconductor chip 50.

Conductive coupling members 700 and 720 such as, for example but not limited to, bumps may be formed on the second normal pads 310 and the second dummy pads 410 of the third and fourth semiconductor chips 50 and 52. The second normal pads 310 and the second dummy pads 410 of the third semiconductor chip 50 may be electrically coupled to the second coupling pads 11A of the substrate 10 by the medium of the conductive coupling members 700. The second normal pads 310 of the fourth semiconductor chip 52 may be electrically coupled to the second through electrodes 60 by the medium of the conductive coupling members 720.

A molding part 40 may be formed on the top surface of the substrate 10 to cover the first to fourth semiconductor chips 20, 22, 50 and 52. The molding part 40 may be used to protect the first to fourth semiconductor chips 20, 22, 50 and 52 from external circumstances. The molding part 40 may include an epoxy molding compound (EMC).

While it is illustrated as an example in an embodiment described above with reference to FIG. 4 that the conductive pillars 61 of the second through electrodes 60 pass through the wafer substrate 110 of the third semiconductor chip 50 on the same lines with (or in vertical alignment with) the second normal pads 310 of the third semiconductor chip 50 and the fourth semiconductor chip 52 is vertically stacked on the third semiconductor chip 50, it is to be noted that the technical spirit of the embodiments are not limited to such an example.

Figure 5:
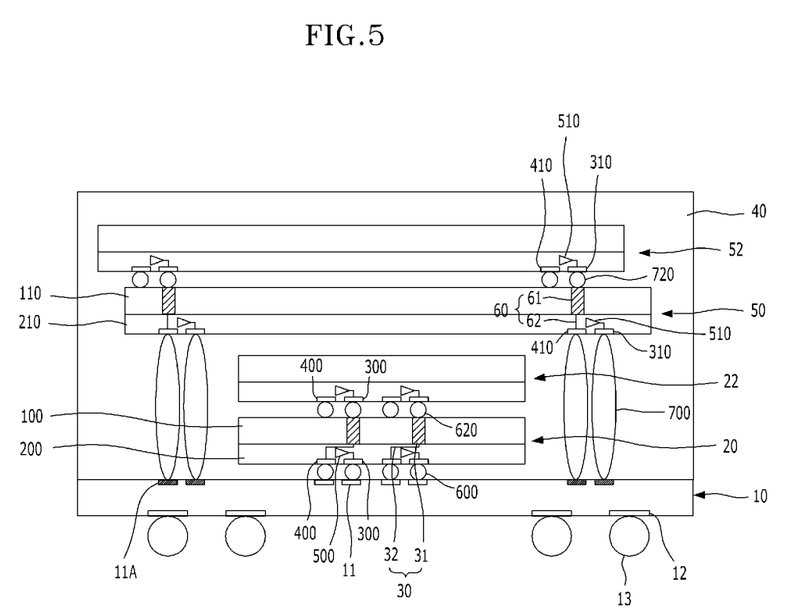
FIG. 5 is a cross-sectional view illustrating a representation of an example of a semiconductor package in accordance with an embodiment.
Figure 6:
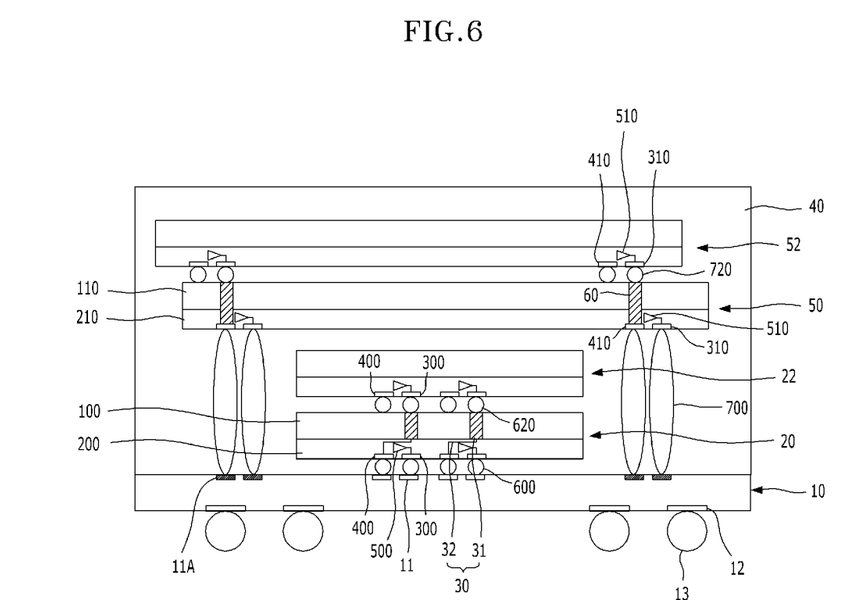
FIG. 6 is a cross-sectional view illustrating a representation of an example of a semiconductor package in accordance with an embodiment.

For example, referring to FIG. 5, the conductive pillars 61 of the second through electrodes 60 may pass through the wafer substrate 110 of the third semiconductor chip 50 on the same lines with (or in vertical alignment with) the second dummy pads 410 of the third semiconductor chip 50. Further, the fourth semiconductor chip 52 may be stacked to deviate with respect to the third semiconductor chip 50 in a such manner that the second normal pads 310 of the fourth semiconductor chip 52 are positioned on the same lines with (or are vertically aligned with) the second dummy pads 410 of the third semiconductor chip 50.

While it is illustrated as examples in the embodiments described above with reference to FIGS. 4 and 5 that each of the second through electrodes 60 is configured by the conductive pillar 61 and the circuit pattern 62, it is to be noted that the embodiments are not limited to such examples. For example, referring to FIG. 6, each of the second through electrodes 60 may be configured by a conductive pillar electrically coupled to the second dummy pad 410 of the third semiconductor chip 50 by passing through the wafer substrate 110 and the active layer 210 of the third semiconductor chip 50.

As is apparent from the above descriptions, according to the various embodiments, because signals may be simultaneously inputted to and simultaneously outputted from stacked semiconductor chips, a bandwidth may be extended. Also, since dummy pads may be disposed in extra spaces left after normal pads are formed, without being specifically limited in terms of position, and thus the change of the existing pad layout structure is not required, it may be possible to decrease difficulties caused by additional times and costs to be incurred according to a pad design change.

The above-described semiconductor packages may be applied to various semiconductor devices and package modules.

Figure 7:
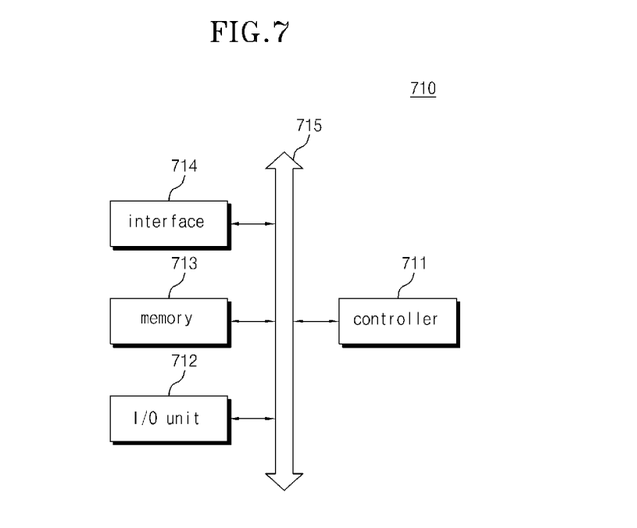
FIG. 7 is a block diagram illustrating a representation of an example of an electronic system including the semiconductor packages in accordance with the various embodiments.

Referring to FIG. 7, the semiconductor packages in accordance with the various embodiments as discussed above (i.e., FIGS. 1-6) may be applied to an electronic system 710. The electronic system 710 may include a controller 711, an input/output unit 712, a memory 713. The electronic system 710 may or may not include an interface 714. The controller 711, the input/output unit 712 and the memory 713 may be electrically coupled with one another through a bus 715 providing a data movement path. The controller 711, the input/output unit 712, the interface 714, and the memory 713 may be electrically coupled with one another through a bus 715 providing a data movement path.

For example, the controller 711 may include at least one microprocessor, at least one digital signal processor, at least one microcontroller, and at least one of logic circuits capable of performing the same functions as these components. The memory 713 may include at least one of the semiconductor packages in accordance with the various embodiments discussed above. The input/output unit 712 may include at least one selected among a keypad, a keyboard, a display device, a touch screen, and so forth. The memory 713 as a device for storing data may store data or/and commands to be executed by the controller 711 or the like.

The memory 713 may include a volatile memory device such as a DRAM or/and a nonvolatile memory device such as a flash memory. For example, the flash memory may be mounted to a mobile terminal or an information processing system such as a desktop computer. The flash memory may be configured by an SSD (solid state drive). In these examples, the electronic system 710 may stably store a large amount of data in a flash memory system.

The electronic system 710 may further include an interface 714 set to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system capable of performing various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

In the examples where the electronic system 710 is a device capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 8:
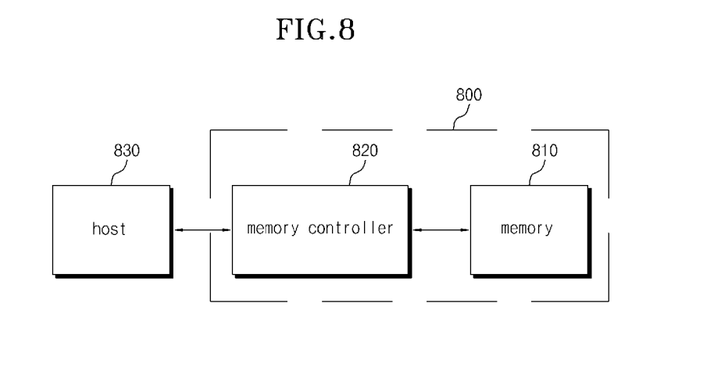
FIG. 8 is a block diagram illustrating a representation of an example of a memory card including the semiconductor packages in accordance with the various embodiments.

Referring to FIG. 8, the semiconductor packages in accordance with the various embodiments as described above (i.e., FIGS. 1-7) may be provided in the form of a memory card 800. For example, the memory card 800 may include a memory 810 such as a nonvolatile memory device and a memory controller 820. The memory 810 and the memory controller 820 may store data or read stored data.

The memory 810 may include at least any one of nonvolatile memory devices to which the semiconductor packages in accordance with the various embodiments as discussed above are applied, and the memory controller 820 may control the memory 810 to read stored data or store data, in response to a read/write request from a host 830.

While various embodiments have been described above, it will be understood to those skilled in the art that the embodiments described are by way of example only. Accordingly, the semiconductor package with an extended bandwidth described herein should not be limited based on the described embodiments.

What is claimed is:

1. A semiconductor package comprising:
   a first semiconductor chip including:
      a bottom surface:
      first normal pads electrically coupled to first input/output circuits over the bottom surface of the first semiconductor chip; and
      first dummy pads located over the bottom surface of the first semiconductor chip;
   a second semiconductor chip stacked over the first semiconductor chip, the second semiconductor chip including:
      a bottom surface;
      first normal pads electrically coupled to first input/output circuits over the bottom surface of the second semiconductor chip; and
      first dummy pads located over the bottom surface of the second semiconductor chip;
   first through electrodes passed through the first semiconductor chip, and electrically coupled to the first dummy pads of the first semiconductor chip and the first normal pads of the second semiconductor chip; and
   a substrate configured to support the bottom surface of the first semiconductor chip, and including first coupling pads electrically coupled with the first normal pads and the first dummy pads of the first semiconductor chip, respectively.

2. The semiconductor package according to claim 1, wherein each of the first and second semiconductor chips comprises:
   an active layer providing the bottom surface and the first input/output circuits; and
   a wafer substrate formed over the active layer.

3. The semiconductor package according to claim 2, wherein each of the first through electrodes comprises:
   a conductive pillar passing through the wafer substrate of the first semiconductor chip; and
   a circuit pattern formed in the active layer of the first semiconductor chip, and electrically coupled to the conductive pillar and the first dummy pad of the first semiconductor chip.

4. The semiconductor package according to claim 3, wherein the conductive pillars are vertically aligned with the first normal pads of the first semiconductor chip, respectively.

5. The semiconductor package according to claim 4, wherein the second semiconductor chip is vertically stacked over the first semiconductor chip such that the first normal pads of the second semiconductor chip are vertically aligned with the first normal pads of the first semiconductor chip, respectively.

6. The semiconductor package according to claim 3, wherein the conductive pillars are vertically aligned with the first dummy pads of the first semiconductor chip, respectively.

7. The semiconductor package according to claim 6, wherein the second semiconductor chip is stacked over the first semiconductor chip to deviate with respect to the first semiconductor chip such that the first normal pads of the second semiconductor chip are vertically aligned with the first dummy pads of the first semiconductor chip, respectively.

8. The semiconductor package according to claim 2, wherein the first through electrodes comprise conductive pillars passing through the wafer substrate and the active layer vertically aligned with the first dummy pads of the first semiconductor chip, and are electrically coupled to the first dummy pads of the first semiconductor chip.

9. The semiconductor package according to claim 1, further comprising:
   third and fourth semiconductor chips stacked over the substrate with the first and second semiconductor chips interposed between the substrate and the third and fourth semiconductor chips, and each of the third and fourth semiconductor chips including, over a bottom surfaces of the third and fourth semiconductor chips, second normal pads electrically coupled with second input/output circuits, and second dummy pads; and
   second through electrodes passing through the third semiconductor chip, and electrically coupled to the second dummy pads of the third semiconductor chip and the second normal pads of the fourth semiconductor chip,
   wherein the substrate further includes second coupling pads electrically coupled with the second normal pads and the second dummy pads of the third semiconductor chip, respectively.

10. The semiconductor package according to claim 9, wherein each of the third and fourth semiconductor chips comprises:
    an active layer providing the bottom surface and the second input/output circuits; and
    a wafer substrate formed over the active layer.

11. The semiconductor package according to claim 10, wherein each of the second through electrodes comprises:
    a conductive pillar passing through the wafer substrate of the third semiconductor chip; and
    a circuit pattern formed over the active layer of the third semiconductor chip, and electrically coupled to the conductive pillar and the second dummy pad of the third semiconductor chip.

12. The semiconductor package according to claim 11, wherein the conductive pillars are vertically aligned with the second normal pads of the third semiconductor chip, respectively.

13. The semiconductor package according to claim 12, wherein the fourth semiconductor chip is vertically stacked over the third semiconductor chip such that the second normal pads of the fourth semiconductor chip are vertically aligned with the second normal pads of the third semiconductor chip, respectively.

14. The semiconductor package according to claim 11, wherein the conductive pillars are vertically aligned with the second dummy pads of the third semiconductor chip, respectively.

15. The semiconductor package according to claim 14, wherein the fourth semiconductor chip is stacked over the third semiconductor chip to deviate with respect to the third semiconductor chip such that the second normal pads of the fourth semiconductor chip are vertically aligned with the second dummy pads of the third semiconductor chip, respectively.

16. The semiconductor package according to claim 10, wherein the second through electrodes comprise conductive pillars passing through the wafer substrate and the active layer vertically aligned with the second dummy pads of the third semiconductor chip, and are electrically coupled to the second dummy pads of the third semiconductor chip.

17. The semiconductor package according to claim 1, further comprising:
    conductive coupling members electrically coupled between:
      the first normal pads of the first semiconductor chip and the first coupling pads of the substrate;
      the first dummy pads of the first semiconductor chip and the first coupling pads of the substrate; and
      the first normal pads of the second semiconductor chip and the first through electrodes of the first semiconductor chip.

18. The semiconductor package according to claim 1, further comprising a molding part formed on a top surface of the substrate to substantially cover the first and second semiconductor chips.

19. The semiconductor package according to claim 9, further comprising:
    conductive coupling members electrically coupled between:
      the first normal pads of the first semiconductor chip and the first coupling pads of the substrate;
      the first dummy pads of the first semiconductor chip and the first coupling pads of the substrate;
      the first normal pads of the second semiconductor chip and the first through electrodes of the first semiconductor chip;
      the second normal pads of the fourth semiconductor chip and the second through electrodes of the third semiconductor chip;
      the second normal pads of the third semiconductor chip and the second coupling pads of the substrate; and the second dummy pads of the third semiconductor chip and the second coupling pads of the substrate.

20. A semiconductor package comprising:
a first semiconductor chip including:
  a bottom surface:
  normal pads electrically coupled to input/output circuits over the bottom surface of the first semiconductor chip; and
  dummy pads located over the bottom surface of the first semiconductor chip;
a second semiconductor chip stacked over the first semiconductor chip, the second semiconductor chip including:
  a bottom surface; and
  normal pads electrically coupled to input/output circuits over the bottom surface of the second semiconductor chip;
through electrodes passed through the first semiconductor chip, and electrically coupled to the dummy pads of the first semiconductor chip and the normal pads of the second semiconductor chip; and
a substrate located below the bottom surface of the first semiconductor chip, and including coupling pads electrically coupled with the normal pads of the first semiconductor chip and the second semiconductor chip, respectively.

* * * * *